(12) United States Patent
Matsushita (10) Patent No.: US 10,827,613 B2
(45) Date of Patent: Nov. 3, 2020

(54) MULTILAYER CIRCUIT BOARD, MULTILAYER ELECTRONIC COMPONENT, AND MODULE

(71) Applicant: Murata Manufacturing Co., Ltd., Nagaokakyo-shi, Kyoto-fu (JP)

(72) Inventor: Shinya Matsushita, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/269,625

(22) Filed: Feb. 7, 2019

(65) Prior Publication Data

US 2019/0174627 A1 Jun. 6, 2019

Related U.S. Application Data

(63) Continuation of application No. PCT/JP2017/026615, filed on Jul. 24, 2017.

(30) Foreign Application Priority Data

Aug. 8, 2016 (JP) .................................. 2016-155499

(51) Int. Cl.
  *H05K 1/11* (2006.01)
  *H05K 1/02* (2006.01)
  (Continued)

(52) U.S. Cl.
  CPC ............... *H05K 1/115* (2013.01); *H05K 1/02* (2013.01); *H05K 1/0218* (2013.01);
  (Continued)

(58) Field of Classification Search
  CPC ........ H05K 1/0222; H05K 1/115; H05K 1/02; H05K 1/0218; H05K 1/0298; H05K 1/16;
  (Continued)

(56) References Cited

U.S. PATENT DOCUMENTS

| 4,658,334 A * | 4/1987 | McSparran .......... H05K 1/0218 |
| | | 174/262 |
| 2011/0156225 A1* | 6/2011 | Hozoji .................. H01L 21/561 |
| | | 257/659 |

(Continued)

FOREIGN PATENT DOCUMENTS

| JP | 04-23490 A | 1/1992 |
| JP | 2013-026330 A | 2/2013 |

(Continued)

OTHER PUBLICATIONS

Definition of "end" from https://www.thefreedictionary.com/end (Year: 2020).*

(Continued)

*Primary Examiner* — Roshn K Varghese
(74) *Attorney, Agent, or Firm* — Keating & Bennett, LLP (57) ABSTRACT

A multilayer circuit board includes a laminate of insulating layers, conductive patterns each provided at an interlayer in the laminate, a via conductor extending through at least one of the insulating layers, and external terminals on a lower main surface of the laminate. A shield electrode layer connected to a ground potential is provided on at least one side surface of the laminate. At least one surrounding conductive pattern surrounding an element to be shielded is provided at an interlayer between corresponding ones of the insulating layers. Both ends of the surrounding conductive pattern are connected to the shield electrode layer.

5 Claims, 8 Drawing Sheets

(51) Int. Cl.
*H05K 9/00* (2006.01)
*H05K 1/16* (2006.01)
*H05K 3/46* (2006.01)
*H05K 1/18* (2006.01)

(52) U.S. Cl.
CPC .............. *H05K 1/0298* (2013.01); *H05K 1/16* (2013.01); *H05K 1/181* (2013.01); *H05K 3/46* (2013.01); *H05K 3/4644* (2013.01); *H05K 9/0022* (2013.01); *H05K 9/0039* (2013.01); *H05K 9/0081* (2013.01); *H05K 2201/1003* (2013.01); *H05K 2201/10015* (2013.01); *H05K 2201/10022* (2013.01); *H05K 2201/10371* (2013.01)

(58) Field of Classification Search
CPC ................. H05K 1/181; H05K 1/0219; H05K 2201/09972; H05K 2201/09981; H05K 2201/09654; H05K 2201/10257; H05K 2201/09672; H05K 9/0037; H05K 9/0022; H05K 9/0081; H05K 9/0039; H05K 2201/10371

USPC .................................................. 174/384, 523
See application file for complete search history.

(56) References Cited

U.S. PATENT DOCUMENTS

| | | | |
|---|---|---|---|
| 2012/0168214 A1* | 7/2012 | Kashiwagi | H01L 23/3121 174/257 |
| 2013/0020119 A1 | 1/2013 | Yoshida | |
| 2013/0307749 A1 | 11/2013 | Nagai | |
| 2015/0043172 A1* | 2/2015 | Mugiya | H05K 9/0045 361/728 |

FOREIGN PATENT DOCUMENTS

| | | |
|---|---|---|
| JP | 5494840 B2 | 5/2014 |
| WO | 2012/105302 A1 | 8/2012 |

OTHER PUBLICATIONS

Official Communication issued in International Patent Application No. PCT/JP2017/026615, dated Sep. 26, 2017.

* cited by examiner

MULTILAYER CIRCUIT BOARD, MULTILAYER ELECTRONIC COMPONENT, AND MODULE

CROSS REFERENCE TO RELATED APPLICATIONS

This application claims the benefit of priority to Japanese Patent Application No. 2016-155499 filed on Aug. 8, 2016 and is a Continuation Application of PCT Application No. PCT/JP2017/026615 filed on Jul. 24, 2017. The entire contents of each application are hereby incorporated herein by reference.

BACKGROUND OF THE INVENTION

1. Field of the Invention

The present invention relates to multilayer circuit boards, and, more particularly, to a multilayer circuit board where a portion in need of shielding is shielded with certainty and improved isolation characteristics are obtained.

The present invention also relates to multilayer electronic components where multilayer circuit boards according to the present invention are used, and, more particularly, to a multilayer electronic component where a portion in need of shielding is shielded with certainty and improved isolation characteristics are obtained.

The present invention also relates to modules where multilayer circuit boards according to the present invention are used, and, more particularly, to a module where a portion in need of shielding is shielded with certainty and improved isolation characteristics are obtained.

2. Description of the Related Art

Multilayer circuit boards, multilayer electronic components where multilayer circuit boards are used, and modules where multilayer circuit boards are used are widely used in various electronic apparatuses.

With multilayer circuit boards, multilayer electronic components, and modules, there are cases where a wiring conductive pattern, an external terminal, a via conductor, and the like through which signals of close frequencies flow, must be disposed close to each other. If they are not effectively shielded in such cases, a so-called cross talk occurs between them. This may reduce the isolation characteristics of the multilayer circuit boards, the multilayer electronic components, and the modules.

Therefore, a method of providing a line-shaped conductive pattern connected to a ground potential in a portion in need of shielding for the isolation between the both sides of the portion has been used.

Figure 8:
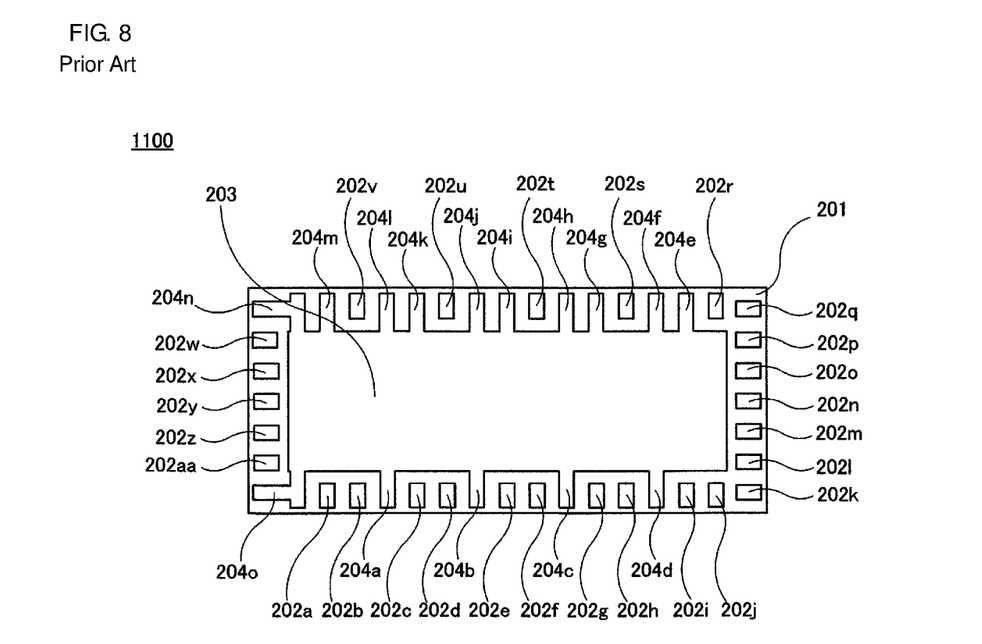
FIG. 8 is a bottom view of a module 1100 disclosed in WO2012/105302.

WO2012/105302 discloses a module including such a line-shaped conductive pattern. FIG. 8 illustrates the lower main surface (bottom surface) of a module 1100 disclosed in WO2012/105302.

In the module 1100, a plurality of external terminals (undersurface terminals) 202a to 202aa are formed on a lower main surface. In this module, a large ground terminal 203 is formed on the lower main surface as one of external terminals.

In the module 1100, a plurality of line-shaped conductive patterns 204a to 204o with first ends connected to the ground terminal 203 and second ends open, are formed. Each of the line-shaped conductive patterns 204a to 204o provides the isolation between corresponding ones of the external terminals 202a to 202aa. For example, the line-shaped conductive pattern 204a shields an area between the external terminals 202b and 202c. The line-shaped conductive pattern 204b shields an area between the external terminals 202d and 202e. Each of the line-shaped conductive patterns 204c to 204o similarly shields between both sides thereof. WO2012/105302 describes each of the line-shaped conductive patterns 204a to 204o as a conductive pattern for suppressing the occurrence of a parasitic capacitance between both sides thereof. For example, WO2012/105302 describes the line-shaped conductive pattern 204a as a conductive pattern for suppressing the occurrence of a parasitic capacitance between the external terminals 202b and 202c. However, it can be said that each of the line-shaped conductive patterns 204a to 204o is used to improve the isolation between both sides thereof.

However, there is a problem that the shielding effectiveness of the module 1100 is weak because the second ends of the line-shaped conductive patterns 204a to 204o with first ends connected to the ground terminal 203, are open. That is, there is a problem that the function of improving the isolation between both sides is insufficient.

SUMMARY OF THE INVENTION

A multilayer circuit board according to a preferred embodiment of the present invention includes a laminate in which a plurality of insulating layers are laminated, conductive patterns each provided at an interlayer between corresponding ones of the insulating layers, a via conductor extending through a corresponding at least one of the insulating layers, and an external terminal provided on a lower main surface of the laminate. A shield electrode layer connected to a ground potential is provided on at least one side surface of the laminate. At least one surrounding conductive pattern surrounding an element to be shielded is provided at an interlayer between corresponding ones of the insulating layers as one of the conductive patterns. Both ends of the surrounding conductive pattern are connected to the shield electrode layer.

The conductive patterns include the surrounding conductive pattern, a wiring conductive pattern, a capacitor conductive pattern, an inductor conductive pattern, and a ground conductive pattern. The wiring conductive pattern is used to connect two points in the same plane. The capacitor conductive pattern is used to define a capacitor. The inductor conductive pattern is used to define an inductor. The ground conductive pattern is a conductive pattern having a ground potential.

The element to be shielded may be at least one of a wiring conductive pattern, a capacitor conductive pattern, an inductor conductive pattern, the via conductor, and the external terminal. The element to be shielded is shielded by the surrounding conductive pattern from the outside of the surrounding conductive pattern.

A portion of the surrounding conductive pattern that is opposite to the element to be shielded and the shield electrode layer may be interconnected to a ground conductive pattern. In this case, the ground conductive pattern becomes a part of the surrounding conductive pattern.

The surrounding conductive pattern and the element to be shielded may be provided at or in the same interlayer between corresponding ones of the insulating layers. In this case, the surrounding conductive pattern shields the element to be shielded from the outside of the surrounding conductive pattern with certainty. In this application, each of the lower main surface and upper main surface of the laminate is handled as one of interlayers between insulating layers.

Alternatively, the surrounding conductive pattern and the element to be shielded may be provided at or in different interlayers between corresponding ones of the insulating layers. The thickness of a single insulating layer is usually small. Accordingly, even if the surrounding conductive pattern and the element to be shielded are provided at or in different interlayers between insulating layers, the surrounding conductive pattern is able to shield the element to be shielded from the outside of the surrounding conductive pattern. As described above, in this application, each of the lower main surface and upper main surface of the laminate is handled as one of interlayers between insulating layers.

In a case where the surrounding conductive pattern and the element to be shielded are provided at or in different adjacent interlayers between insulating layers, it is desired that the surrounding conductive pattern and the element to be shielded not overlap when the laminate is seen through in a direction in which the insulating layers are laminated. In this case, the occurrence of a stray capacitance between the surrounding conductive pattern and the element to be shielded is prevented. In contrast, it is also desired that the surrounding conductive pattern and the element to be shielded overlap when the laminate is seen through in a direction in which the insulating layers are laminated. In this case, a capacitance between the surrounding conductive pattern and the element to be shielded is able to be used as a capacitor included in the multilayer circuit board.

A multilayer electronic component preferably includes a multilayer circuit board according to a preferred embodiment of the present invention. In this case, it is desired that the shield electrode layer provided on at least one side surface of the laminate extend to cover an upper main surface of the laminate. Since a portion in need of shielding in the multilayer electronic component is shielded by the surrounding conductive pattern, the multilayer electronic component having excellent isolation characteristics is able to be obtained. Since the shield electrode layer shields a circuit in the multilayer electronic component from the outside, the circuit is prevented from being affected by external noise and providing noise to the outside.

A module preferably includes a multilayer circuit board according to a preferred embodiment of the present invention. In this case, it is desired that a mounting terminal be provided on an upper main surface of the multilayer circuit board, an electronic component be disposed on the mounting terminal, a sealing resin layer be provided on the upper main surface of the multilayer circuit board to cover the electronic component, and the shield electrode layer provided on at least one side surface of the multilayer circuit board extend to cap a surface of the sealing resin layer. Since a portion in need of shielding in the module is shielded by the surrounding conductive pattern, the module having excellent isolation characteristics is able to be obtained. Since the shield electrode layer shields a circuit in the module from the outside, the circuit is prevented from being affected by external noise and providing noise to the outside.

A multilayer circuit board according to a preferred embodiment of the present invention has excellent isolation characteristics because a surrounding conductive pattern connected to a ground potential completely surrounds an element to be shielded to shield the element to be shielded from the outside of the surrounding conductive pattern with certainty. A multilayer circuit board according to a preferred embodiment of the present invention is able to be more easily manufactured and have a higher non-defective rate as compared with a multilayer circuit board in the related art in which the end portion of a line-shaped conductive pattern and a via conductor are connected.

A multilayer electronic component and a module each including a multilayer circuit board according to a preferred embodiment of the present invention also have excellent isolation characteristics, are easily manufactured, and have a high non-defective rate.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be described below with reference to the accompanying drawings.

The preferred embodiments of the present invention are described by way of example, and the present invention is not limited to the contents of the preferred embodiments. The contents described in the different preferred embodiments can be combined. In this case, the contents to be carried out are included in the present invention. The drawings are used to aid the understanding of the specification and are schematically illustrated in some cases. In some cases, the ratio of dimensions of components or the ratio of dimensions between components in the drawings does not match the ratio of dimensions of components or the ratio of dimensions between components described in the specification. In some cases, a component described in the specification is omitted in the drawings and the number of components is omitted in the drawings.

First Preferred Embodiment

Figure 1:
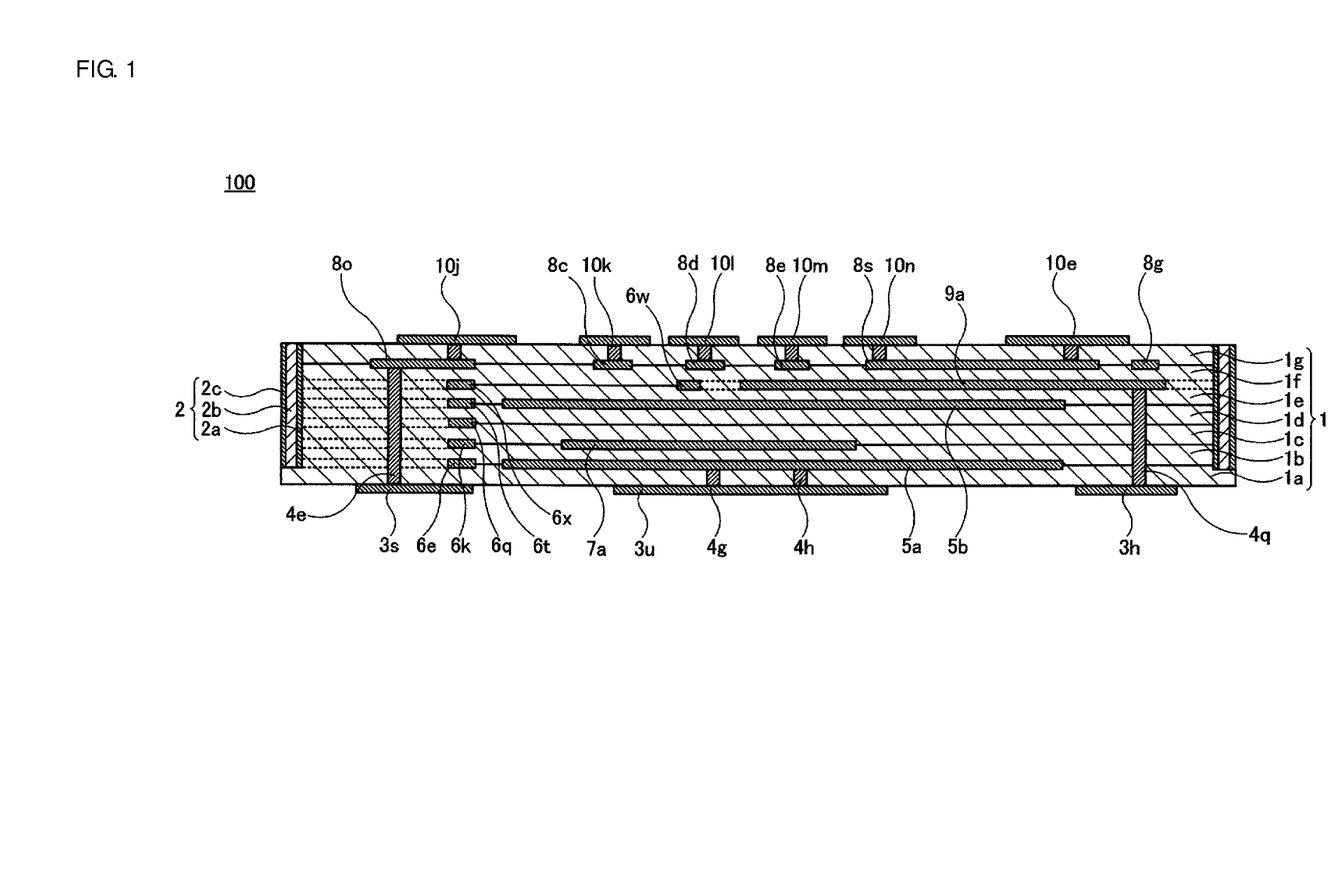
FIG. 1 is a cross-sectional view of a multilayer circuit board 100 according to a first preferred embodiment of the present invention.
Figure 2:
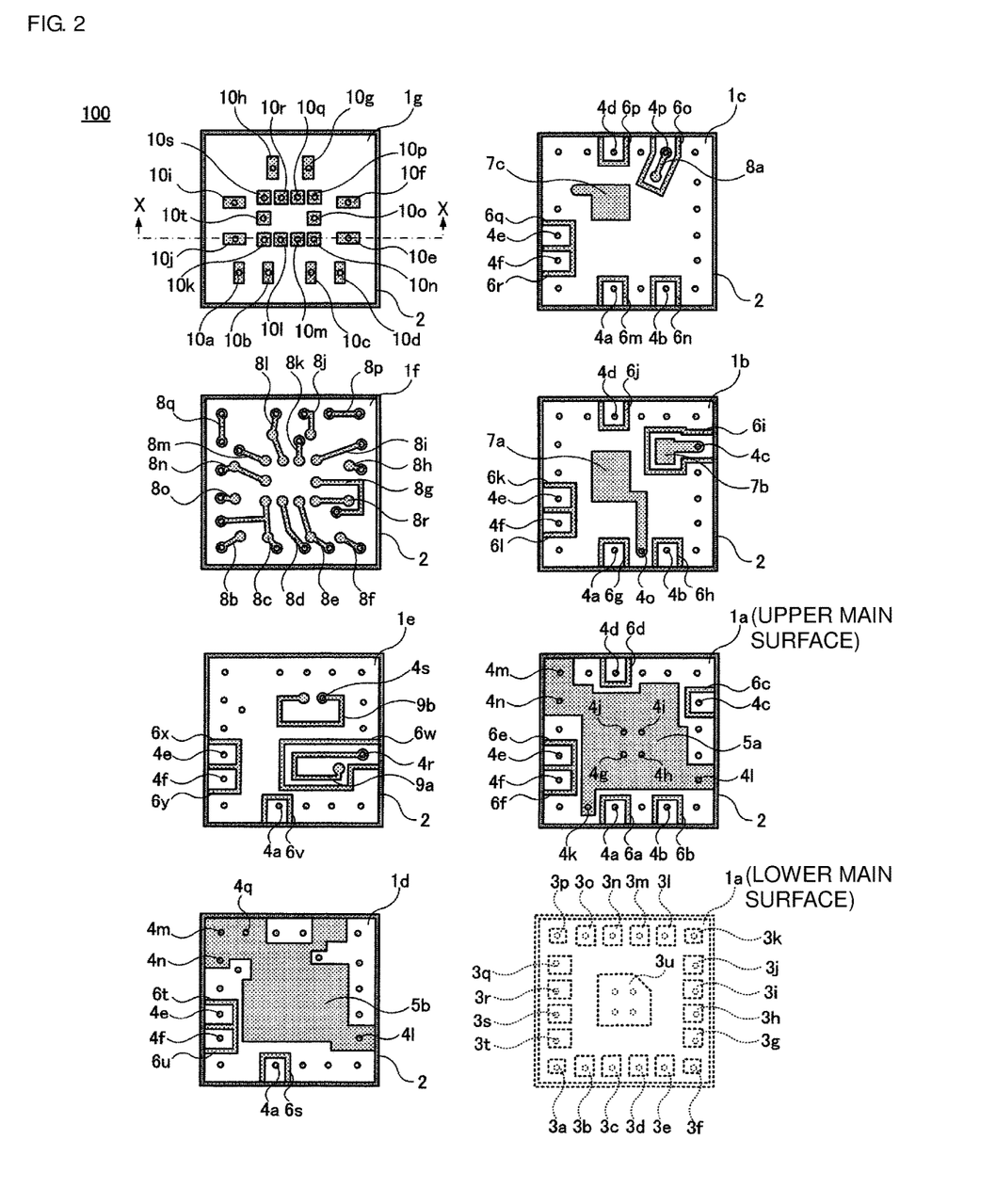
FIG. 2 is a stacking diagram illustrating insulating layers 1a to 1g included in a laminate 1 in the multilayer circuit board 100.

FIGS. 1 and 2 illustrate a multilayer circuit board 100 according to the first preferred embodiment of the present invention. FIG. 1 is a cross-sectional view of the multilayer circuit board 100. FIG. 2 is a stacking diagram illustrating insulating layers 1a to 1g included in a laminate 1 in the multilayer circuit board 100. FIG. 1 is a cross-sectional view taken along dot-and-dash line X-X in FIG. 2. FIG. 2 illustrates the upper main surfaces of the insulating layers 1a to 1g and also illustrates external terminals 3a to 3u provided on the lower main surface of the insulating layer 1a when the insulating layer 1a is seen through.

The multilayer circuit board 100 includes the laminate 1.

In this preferred embodiment, as a material for the laminate 1, low temperature co-fired ceramics is preferably used, for example. The use of low temperature co-fired ceramics makes it possible to perform the formation of a conductive pattern, a terminal, a via conductor, and the like and the firing of the laminate 1 at the same time. The easy manufacture of the laminate 1 is therefore able to be achieved. However, the material for the laminate 1 may be any material such as another type of ceramics or a resin.

The laminate 1 includes the seven insulating layers 1a to 1g laminated in this order from the bottom, for example.

At the laminate 1, a shield electrode layer 2 surrounds the four side surfaces of the laminate 1. In this preferred embodiment, the shield electrode layer 2 preferably includes three layers, a lower layer 2a made of SUS (stainless steel), a middle layer 2b made of Cu, and an upper layer 2c made of SUS, as illustrated in FIG. 1, for example. In FIG. 2, the shield electrode layer 2 is illustrated as a single layer for purposes of clarity. The configuration and material of the shield electrode layer 2 may be optionally set and are not limited to the above-described configuration and material.

As will be described below, the shield electrode layer is connected to ground conductive patterns 5a and 5b in the laminate 1, thereby having a ground potential. The shield electrode layer 2 shields a circuit in the multilayer circuit board 100 from the outside to prevent the circuit from being affected by external noise and providing noise to the outside.

The insulating layers 1a to 1g included in the laminate 1 will be described in detail below.

On the lower main surface of the insulating layer 1a, external terminals 3a to 3u are provided. The external terminal 3u is larger than the external terminals 3a to 3t. The external terminals 3a to 3t preferably have a rectangular or substantially rectangular shape around the external terminal 3u. The external terminals 3a to 3t include signal terminals, control terminals, and ground terminals. The external terminal 3u is a ground terminal.

A plurality of via conductors (via conductors 4a to 4n and the like) extend through the insulating layer 1a. The addition of a reference numeral to a via conductor and the description of the via conductor are performed only when needed and are omitted when not needed.

On the upper main surface of the insulating layer 1a, the ground conductive pattern 5a is provided. The ground conductive pattern 5a is connected to the shield electrode layer 2 at a plurality of points. The ground conductive pattern 5a is connected to the external terminal 3u via the via conductors 4g, 4h, 4i, and 4j, is connected to the external terminal 3b via the via conductor 4k, is connected to the external terminal 3g via the via conductor 4l, is connected to the external terminal 3p via the via conductor 4m, and is connected to the external terminal 3q via the via conductor 4n.

On the upper main surface of the insulating layer 1a, surrounding conductive patterns 6a to 6f are provided. Respective portions of the surrounding conductive patterns 6e and 6f are common portions. Both ends of each of the surrounding conductive patterns 6a to 6f are connected to the shield electrode layer 2, so that each of the conductive patterns 6a to 6f has a ground potential.

Each of the surrounding conductive patterns 6a to 6f is provided for an element to be shielded (an element that is surrounded and shielded). The surrounding conductive pattern 6a surrounds the via conductor 4a to shield the via conductor 4a from the outside of the surrounding conductive pattern 6a. The surrounding conductive pattern 6b surrounds the via conductor 4b to shield the via conductor 4b from the outside of the surrounding conductive pattern 6b. The surrounding conductive pattern 6c surrounds the via conductor 4c to shield the via conductor 4c from the outside of the surrounding conductive pattern 6c. The surrounding conductive pattern 6d surrounds the via conductor 4d to shield the via conductor 4d from the outside of the surrounding conductive pattern 6d. The surrounding conductive pattern 6e surrounds the via conductor 4e to shield the via conductor 4e from the outside of the surrounding conductive pattern 6e. The surrounding conductive pattern 6f surrounds the via conductor 4f to shield the via conductor 4f from the outside of the surrounding conductive pattern 6f.

The surrounding conductive patterns 6a to 6f also surround the external terminals 3c, 3e, 3j, 3n, 3s, and 3t, respectively, provided on the lower main surface of the insulating layer 1a which is different from the layer on which the surrounding conductive patterns 6a to 6f are provided. That is, since the thickness of the insulating layer 1a is very thin, the surrounding conductive patterns 6a to 6f surround the external terminals 3c, 3e, 3j, 3n, 3s, and 3t, respectively, provided on a layer different from the layer on which the surrounding conductive patterns 6a to 6f shield the external terminals 3c, 3e, 3j, 3n, 3s, and 3t from the outside. More specifically, the surrounding conductive pattern 6a surrounds the external terminal 3c to shield the external terminal 3c from the outside of the surrounding conductive pattern 6a. The surrounding conductive pattern 6b surrounds the external terminal 3e to shield the external terminal 3e from the outside of the surrounding conductive pattern 6b. The surrounding conductive pattern 6c surrounds the external terminal 3j to shield the external terminal 3j from the outside of the surrounding conductive pattern 6c. The surrounding conductive pattern 6d surrounds the external terminal 3n to shield the external terminal 3n from the outside of the surrounding conductive pattern 6d. The surrounding conductive pattern 6e surrounds the external terminal 3s to shield the external terminal 3s from the outside of the surrounding conductive pattern 6e. The surrounding conductive pattern 6f surrounds the external terminal 3t to shield the external terminal 3t from the outside of the surrounding conductive pattern 6f.

A plurality of via conductors (the via conductors 4a to 4f, a via conductor 4o, and the like) extend through the insulating layer 1b.

On the upper main surface of the insulating layer 1b, capacitor conductive patterns 7a and 7b are provided. The capacitor conductive pattern 7a defines a capacitor using a capacitance between the capacitor conductive pattern 7a and the ground conductive pattern 5a. The capacitor conductive pattern 7a is connected to the external terminal 3d via the via conductor 4o. The capacitor conductive pattern 7b also defines a capacitor using a capacitance between the capacitor conductive pattern 7b and the ground conductive pattern 5a. The capacitor conductive pattern 7b is connected to the external terminal 3j via the via conductor 4c.

On the upper main surface of the insulating layer 1b, surrounding conductive patterns 6g to 6l are provided. Both ends of each of the surrounding conductive patterns 6g to 6l are connected to the shield electrode layer 2, so that each of the surrounding conductive patterns 6g to 6l has a ground potential. The surrounding conductive pattern 6g surrounds the via conductor 4a to shield the via conductor 4a from the outside of the surrounding conductive pattern 6g. The surrounding conductive pattern 6h surrounds the via conductor 4b to shield the via conductor 4b from the outside of the surrounding conductive pattern 6h. The surrounding conductive pattern 6i surrounds the capacitor conductive pattern 7b and the via conductor 4c to shield the capacitor conductive pattern 7b and the via conductor 4c from the outside of the surrounding conductive pattern 6i. The surrounding conductive pattern 6j surrounds the via conductor 4d to shield the via conductor 4d from the outside of the surrounding conductive pattern 6j. The surrounding conductive pattern 6k surrounds the via conductor 4e to shield the via conductor 4e from the outside of the surrounding conductive pattern 6k. The surrounding conductive pattern 6l surrounds the via conductor 4f to shield the via conductor 4f from the outside of the surrounding conductive pattern 6l.

A plurality of via conductors (the via conductors 4a, 4b and 4d to 4f, a via conductor 4p, and the like) extend through the insulating layer 1c.

On the upper main surface of the insulating layer 1c, a capacitor conductive pattern 7c is provided. The capacitor conductive pattern 7c defines a capacitor using a capacitance between the capacitor conductive pattern 7c and the capacitor conductive pattern 7a. In addition, the capacitor conductive pattern 7c defines a capacitor using a capacitance between the capacitor conductive pattern 7c and the ground conductive pattern 5b to be described below.

On the upper main surface of the insulating layer 1c, a wiring conductive pattern 8a is provided. The wiring conductive pattern 8a is connected to the external terminal 3l via the via conductor 4p.

On the upper main surface of the insulating layer 1c, surrounding conductive patterns 6m to 6r are further provided. Both ends of each of the surrounding conductive patterns 6m to 6r are connected to the shield electrode layer 2, so that each of the surrounding conductive patterns 6m to 6r has a ground potential. The surrounding conductive pattern 6m surrounds the via conductor 4a to shield the via conductor 4a from the outside of the surrounding conductive pattern 6m. The surrounding conductive pattern 6n surrounds the via conductor 4b to shield the via conductor 4b from the outside of the surrounding conductive pattern 6n. The surrounding conductive pattern 6o surrounds the wiring conductive pattern 8a and the via conductor 4p to shield the wiring conductive pattern 8a and the via conductor 4p from the outside of the surrounding conductive pattern 6o. The surrounding conductive pattern 6p surrounds the via conductor 4d to shield the via conductor 4d from the outside of the surrounding conductive pattern 6p. The surrounding conductive pattern 6q surrounds the via conductor 4e to shield the via conductor 4e from the outside of the surrounding conductive pattern 6q. The surrounding conductive pattern 6r surrounds the via conductor 4f to shield the via conductor 4f from the outside of the surrounding conductive pattern 6r.

A plurality of via conductors (the via conductors 4a, 4e, 4f, 4l to 4n, a via conductor 4q, and the like) extend through the insulating layer 1d.

On the upper main surface of the insulating layer 1d, the ground conductive pattern 5b is provided. The ground conductive pattern 5b is connected to the shield electrode layer 2 at a plurality of points. The ground conductive pattern 5b is connected to the ground conductive pattern 5a through the via conductors 4l to 4n. The ground conductive pattern 5b is further connected to the external terminal 3o via the via conductor 4q.

On the upper main surface of the insulating layer 1d, surrounding conductive patterns 6s to 6u are provided. Both ends of each of the surrounding conductive patterns 6s to 6u are connected to the shield electrode layer 2, so that each of the surrounding conductive patterns 6s to 6u has a ground potential. The surrounding conductive pattern 6s surrounds the via conductor 4a to shield the via conductor 4a from the outside of the surrounding conductive pattern 6s. The surrounding conductive pattern 6t surrounds the via conductor 4e to shield the via conductor 4e from the outside of the surrounding conductive pattern 6t. The surrounding conductive pattern 6u surrounds the via conductor 4f to shield the via conductor 4f from the outside of the surrounding conductive pattern 6u.

A plurality of via conductors (the via conductors 4a, 4e, and 4f, via conductors 4r and 4s, and the like) extend through the insulating layer 1e.

On the upper main surface of the insulating layer 1e, inductor conductive patterns 9a and 9b are provided. The inductor conductive pattern 9a is connected to the external terminal 3h via the via conductor 4r. The inductor conductive pattern 9b is connected to the wiring conductive pattern 8a via the via conductor 4s.

On the upper main surface of the insulating layer 1e, surrounding conductive patterns 6v to 6y are further provided. Both ends of each of the surrounding conductive patterns 6v to 6y are connected to the shield electrode layer 2, so that each of the surrounding conductive patterns 6v to 6y has a ground potential. The surrounding conductive pattern 6v surrounds the via conductor 4a to shield the via conductor 4a from the outside of the surrounding conductive pattern 6v. The surrounding conductive pattern 6w surrounds the inductor conductive pattern 9a and the via conductor 4r to shield the inductor conductive pattern 9a and the via conductor 4r from the outside of the surrounding conductive pattern 6w. The surrounding conductive pattern 6x surrounds the via conductor 4e to shield the via conductor 4e from the outside of the surrounding conductive pattern 6x. The surrounding conductive pattern 6y surrounds the via conductor 4f to shield the via conductor 4f from the outside of the surrounding conductive pattern 6y.

A plurality of via conductors extend through the insulating layer 1f.

On the upper main surface of the insulating layer 1f, a plurality of wiring conductive patterns 8b to 8r are provided. The wiring conductive patterns 8g and 8k also define and function as inductor conductive patterns. The wiring conductive patterns 8b to 8q are connected to the external terminals 3a 3c, 3e, 3f, 3i, 3k, 3m, 3n, 3r to 3t, the capacitor conductive pattern 7c, the ground conductive pattern 5b, and the inductor conductive patterns 9a and 9b through via conductors. The detailed descriptions of the connection relationships between them will be omitted for the sake of brevity.

A plurality of via conductors extend through the insulating layer 1g.

On the upper main surface of the insulating layer 1g, a plurality of mounting terminals 10a to 10t are provided. The mounting terminals 10a to 10t are connected to the wiring conductive patterns 8b to 8o and 8r through via conductors. The detailed descriptions of the connection relationships between them will be omitted for the sake of brevity.

Each of the external terminals 3a to 3t, the via conductors 4a to 4s and the like, the ground conductive patterns 5a and 5b, the surrounding conductive patterns 6a to 6w, the capacitor conductive patterns 7a to 7c, the wiring conductive patterns 8a to 8r, the inductor conductive patterns 9a and 9b, and the mounting terminals 10a to 10t can be mainly composed of Cu, Ag, or the alloy of Cu and Ag. On the surfaces of the external terminals 3a to 3u and the mounting terminals 10a to 10t, plating layers may be further provided.

The multilayer circuit board 100 according to the first preferred embodiment having the above-described configuration can be manufactured using, for example, a multilayer circuit board manufacturing method that has been typically performed. This will be briefly described below.

First, a plurality of ceramic green sheets are produced using a predetermined material (such as low temperature co-fired ceramics). Subsequently, holes are formed through the ceramic green sheets for the formation of via conductors. Subsequently, the holes for via conductors are filled with a conductive paste. In addition, a conductive paste is applied to the main surfaces of the ceramic green sheets for the formation of patterns to be used for the formation of the external terminals 3a to 3u, the ground conductive patterns 5a and 5b, the surrounding conductive patterns 6a to 6w, the capacitor conductive patterns 7a to 7c, the wiring conductive patterns 8a to 8r, the inductor conductive patterns 9a and 9b, and the mounting terminals 10a to 10t. Subsequently, the ceramic green sheets are laminated and pressurized for the production of an unfired mother laminate. Subsequently, the unfired mother laminate is cut into respective sizes of multilayer circuit boards for the creation of unfired laminates. Subsequently, the unfired laminate is subjected to firing in accordance with a predetermined profile for the production of the laminate 1. Subsequently, on the side surfaces of the laminate 1, the shield electrode layer 2 including the lower layer 2a, the middle layer 2b, and the upper layer 2c is formed by, for example, a sputtering method. Thus, the multilayer circuit board 100 according to the first preferred embodiment is completed.

As described above, in the multilayer circuit board 100 according to the first preferred embodiment, each of the surrounding conductive patterns 6a to 6w is formed in an interlayer (an interlayer between corresponding ones of the insulating layers 1a to 1g) in the laminate 1. Both ends of each of the surrounding conductive patterns 6a to 6w are connected to the shield electrode layer 2 formed on the side surfaces of the laminate 1. The shield electrode layer 2 has a ground potential because it is connected to the ground conductive patterns 5a and 5b.

Each of the surrounding conductive patterns 6a to 6w whose both ends are connected to the shield electrode layer 2 having a ground potential completely surrounds an element to be shielded, thus shielding the element to be shielded from the outside with certainty. Accordingly, the isolation characteristics of the multilayer circuit board 100 are improved.

In the multilayer circuit board 100, the ends of each of the surrounding conductive patterns 6a to 6w and the shield electrode layer 2 are connected with a fixed width. Accordingly, even if the positions where the application of a conductive paste is performed for the formation of the surrounding conductive patterns 6a to 6w deviate, a bad connection between them does not occur. That is, the multilayer circuit board 100 is able to be more easily manufactured and has a lower incidence of defectives as compared with a multilayer circuit board in the related art in which the end of a line-shaped conductive pattern and a via conductor are connected.

In the multilayer circuit board 100, the shield electrode layer 2 shields a circuit in the laminate 1 from the outside. The circuit is therefore prevented from being affected by external noise and providing noise to the outside.

Second Preferred Embodiment

Figure 3:
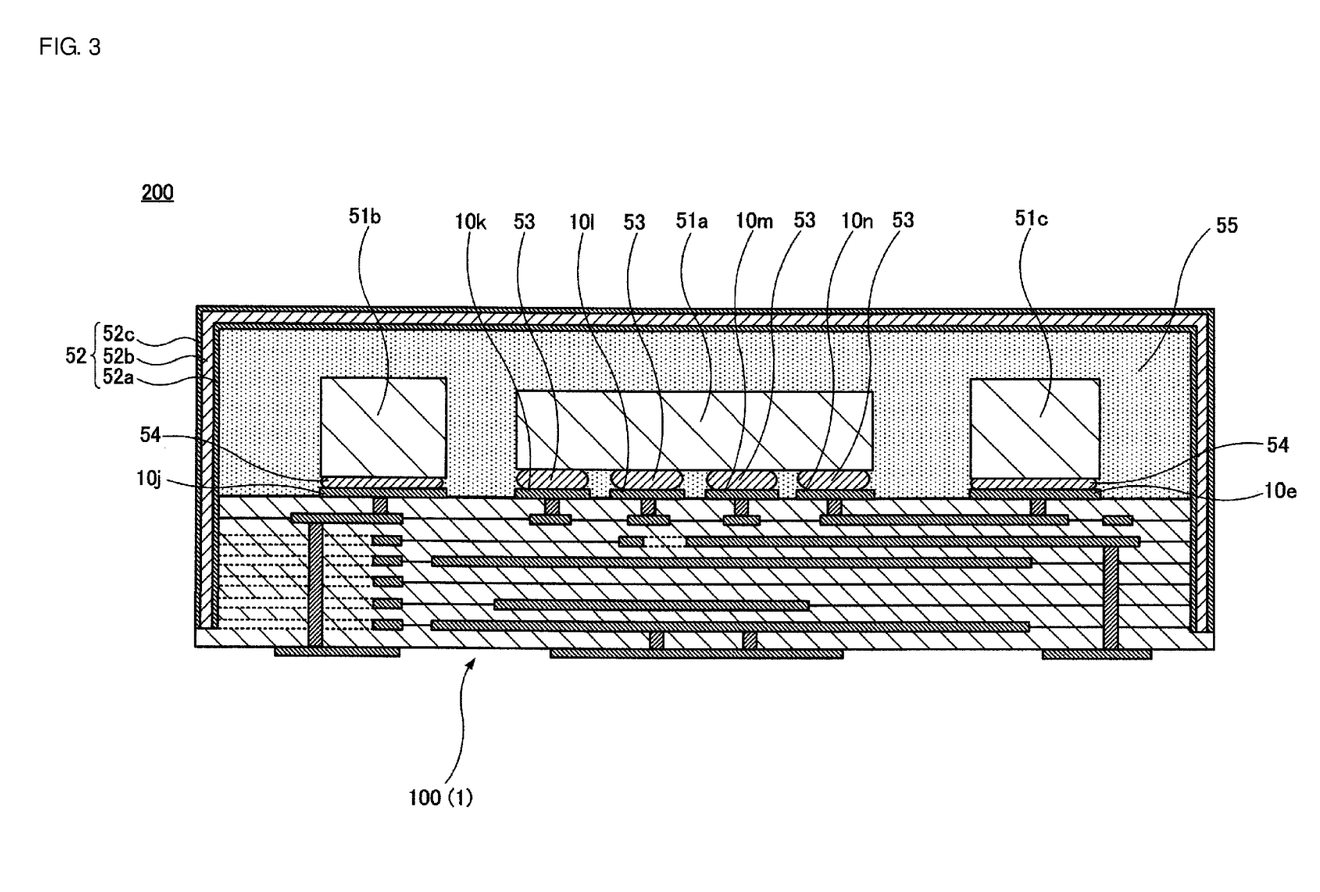
FIG. 3 is a cross-sectional view of a module 200 according to a second preferred embodiment of the present invention.

FIG. 3 is a diagram illustrating a module 200 according to the second preferred embodiment of the present invention. FIG. 2 is a cross-sectional view of the module 200.

In the module 200, electronic components 51a to 51c and the like are disposed on the laminate 1 in the multilayer circuit board 100 according to the first preferred embodiment. More specifically, the electronic components 51a to 51c and the like are disposed on the mounting terminals 10a to 10t provided on the upper main surface of the laminate 1 using bumps 53 and solder 54. In FIG. 3, the electronic component 51a is a semiconductor device and the electronic components 51b and 51c are passive components such as a capacitor, an inductor, and a resistor. The types of electronic components to be disposed and the number of electronic components to be disposed may be optionally set and are not limited to those illustrated in FIG. 3.

In the module 200, a sealing resin layer 55 is provided on the upper main surface of the laminate 1 to cover the electronic components 51a to 51c and the like. A shield electrode layer 52 including three layers, a lower layer 52a made of SUS, a middle layer 52b made of Cu, and the upper layer 52c made of SUS, is provided on the side surfaces of the laminate 1 and the surface of the sealing resin layer 55.

Both ends of each of the surrounding conductive patterns 6a to 6w provided at an interlayer (an interlayer between corresponding ones of the insulating layers 1a to 1g) in the laminate 1 are connected to the shield electrode layer 52. Each of the surrounding conductive patterns 6a to 6w completely surrounds an element to be shielded to shield the element to be shielded from the outside.

The module 200 according to the second preferred embodiment having the above-described configuration can be manufactured using, for example, the following method.

First, the laminate 1 is produced using the method described in the first preferred embodiment. Subsequently, the electronic components 51a to 51c and the like are disposed on the mounting terminals 10a to 10t formed on the upper main surface of the laminate 1 using the bump 53 and the solder 54. Subsequently, a semi-molten resin sheet is made to cover the upper main surface of the laminate 1 on which the electronic components 51a to 51c and the like are disposed, is pressurized, and is heated to be solidified, so that the sealing resin layer 55 is formed. Subsequently, the shield electrode layer 52 including the lower layer 52a, the middle layer 52b, and an upper layer 52c is formed on the side surfaces of the laminate 1 and the surface of the sealing resin layer 55 by, for example, a sputtering method. Thus, the module 200 according to the second preferred embodiment is completed.

The module 200 according to the second preferred embodiment has excellent isolation characteristics because each portion in need of shielding in the module 200 is shielded by corresponding one of the surrounding conductive patterns 6a to 6w.

Third Preferred Embodiment

Figure 4:
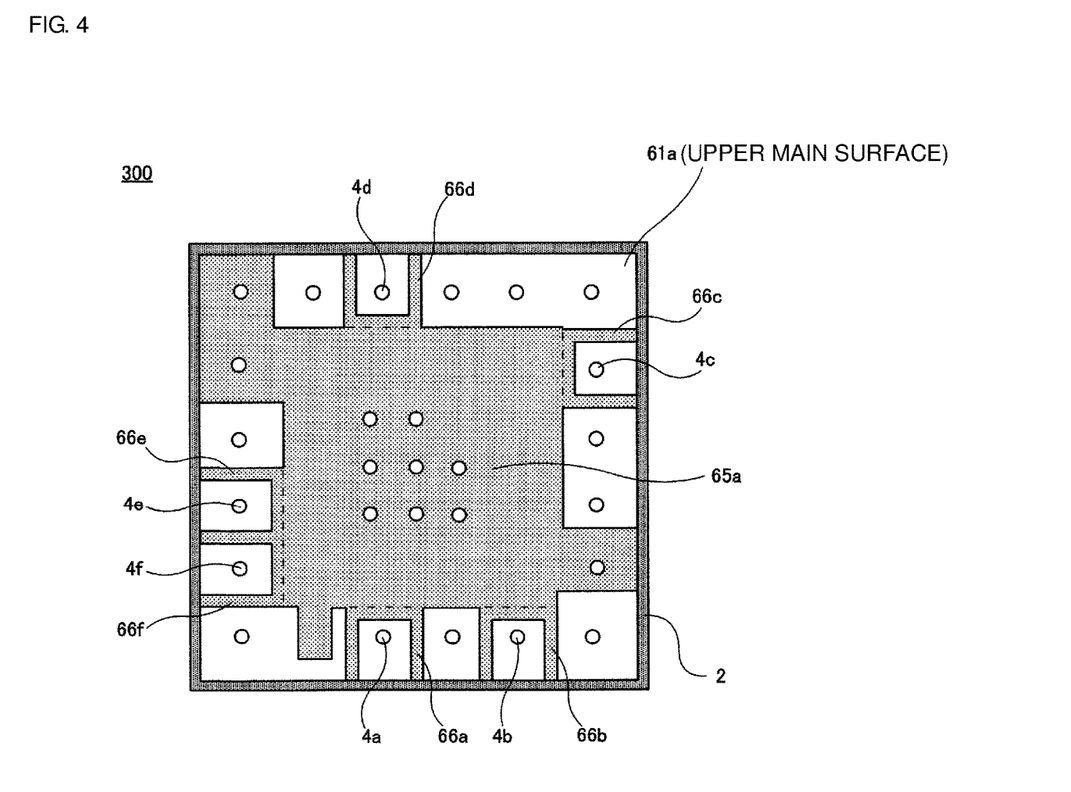
FIG. 4 is a plan view of an insulating layer 61a included in a laminate 61 in a multilayer circuit board 300 according to a third preferred embodiment of the present invention.

FIG. 4 is a diagram illustrating a multilayer circuit board 300 according to the third preferred embodiment of the present invention. FIG. 4 is a plan view of the upper main surface of an insulating layer 61a included in a laminate 61 in the multilayer circuit board 300.

The multilayer circuit board 300 according to the third preferred embodiment is obtained by making changes to the multilayer circuit board 100 according to the first preferred embodiment. More specifically, in the multilayer circuit board 100, all of the surrounding conductive patterns 6a to 6f provided on the upper main surface of the insulating layer 1a are located apart from the ground conductive pattern 5a. In the multilayer circuit board 300 obtained by making changes to the multilayer circuit board 100, the intermediate portions of surrounding conductive patterns 66a to 66f provided on the upper main surface of the insulating layer 61a are connected to a ground conductive pattern 65a.

Also in the multilayer circuit board 300, the surrounding conductive patterns 66a to 66f shield the via conductors 4a to 4f that are elements to be shielded from the outside with certainty. In addition, the miniaturization of the laminate 61 is able to be achieved in the multilayer circuit board 300 because space in the plane direction of the insulating layer 61a is effectively used.

Fourth Preferred Embodiment

Figure 5:
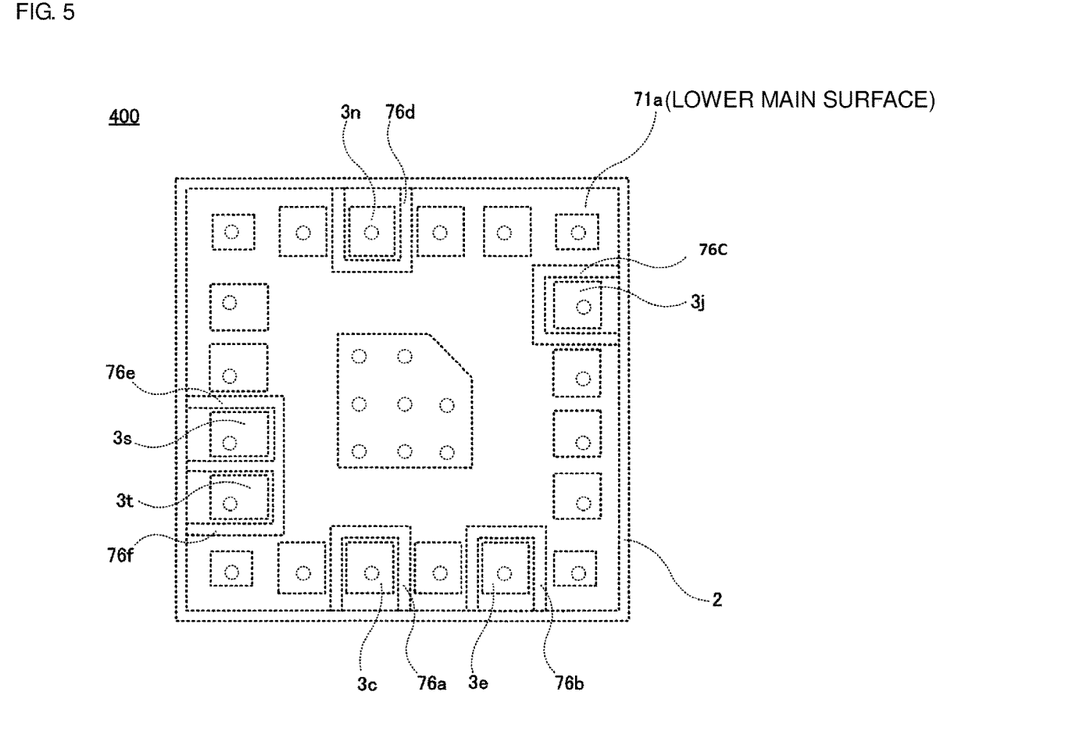
FIG. 5 is a perspective view of the lower main surface of an insulating layer 71a included in a laminate 71 in a multilayer circuit board 400 according to a fourth preferred embodiment of the present invention.

FIG. 5 is a diagram illustrating a multilayer circuit board 400 according to the fourth preferred embodiment of the present invention. FIG. 5 is a perspective view of the lower main surface of an insulating layer 71a in a laminate 71 in the multilayer circuit board 400.

The multilayer circuit board 400 according to the fourth preferred embodiment is obtained by making changes to the multilayer circuit board 100 according to the first preferred embodiment. More particularly, in the multilayer circuit board 100, all of the surrounding conductive patterns 6a to 6f are provided on the upper main surface of the insulating layer 1a. In the multilayer circuit board 400, also on the lower main surface of the insulating layer 71a, surrounding conductive patterns 76a to 76f are provided. That is, in the multilayer circuit board 400, the surrounding conductive patterns 76a to 76f are formed on the same layer (the same surface) as the external terminals 3c, 3e, 3j, 3s, and 3t that are elements to be shielded. The surrounding conductive pattern 76a surrounds the external terminal 3c. The surrounding conductive pattern 76b surrounds the external terminal 3e. The surrounding conductive pattern 76c surrounds the external terminal 3j. The surrounding conductive pattern 76d surrounds the external terminal 3n. The surrounding conductive pattern 76e surrounds the external terminal 3s. The surrounding conductive pattern 76f surrounds the external terminal 3t. Both ends of each of the surrounding conductive patterns 76a to 76f are connected to the shield electrode layer 2.

In the multilayer circuit board 400, the surrounding conductive patterns 76a to 76f, which are provided on the same surface as the shield the external terminals 3c, 3e, 3j, 3s, and 3t, shield the shield the external terminals 3c, 3e, 3j, 3s, and 3t, respectively from the outside with more certainty.

Fifth Preferred Embodiment

Figure 6:
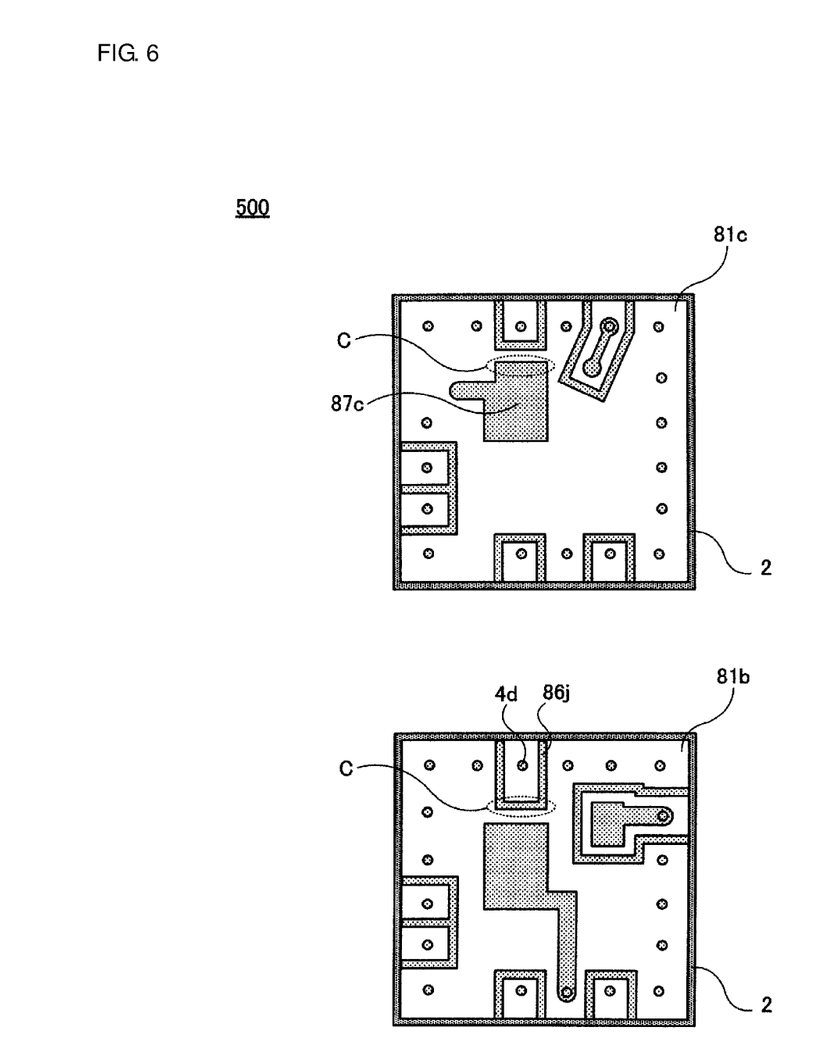
FIG. 6 is a plan view (stacking diagram) of insulating layers 81b and 81c included in a laminate 81 in a multilayer circuit board 500 according to a fifth preferred embodiment of the present invention.

FIG. 6 is a diagram illustrating a multilayer circuit board 500 according to the fifth preferred embodiment of the present invention. FIG. 6 is a plan view (stacking diagram) of the upper main surfaces of insulating layers 81b and 81c included in a laminate 81 in the multilayer circuit board 500.

The multilayer circuit board 500 according to the fifth preferred embodiment is obtained by making changes to the multilayer circuit board 100 according to the first preferred embodiment. More specifically, in the multilayer circuit board 100, the surrounding conductive pattern 6j provided on the upper main surface of the insulating layer 1b and the capacitor conductive pattern 7c provided on the upper main surface of the insulating layer 1c do not overlap. In the multilayer circuit board 500 obtained by making changes to the multilayer circuit board 100, a conductive pattern 86j extending toward the center as compared with the surrounding conductive pattern 6j is provided on the upper main surface of the insulating layer 81b and a capacitor conductive pattern 87c extending outward as compared with the capacitor conductive pattern 7c is provided on the upper main surface of the insulating layer 81c to allow the conductive pattern 86j and the capacitor conductive pattern 87c to overlap each other. A new capacitor C is added using a capacitance between the conductive pattern 86j and the capacitor conductive pattern 87c.

Thus, the conductive pattern 86j can be used as one of electrodes of a capacitor. The capacitor C is a so-called shunt capacitor because the conductive pattern 86j has a ground potential. In the multilayer circuit board 500, the capacitor C is used as part of an internal circuit.

Sixth Preferred Embodiment

Figure 7:
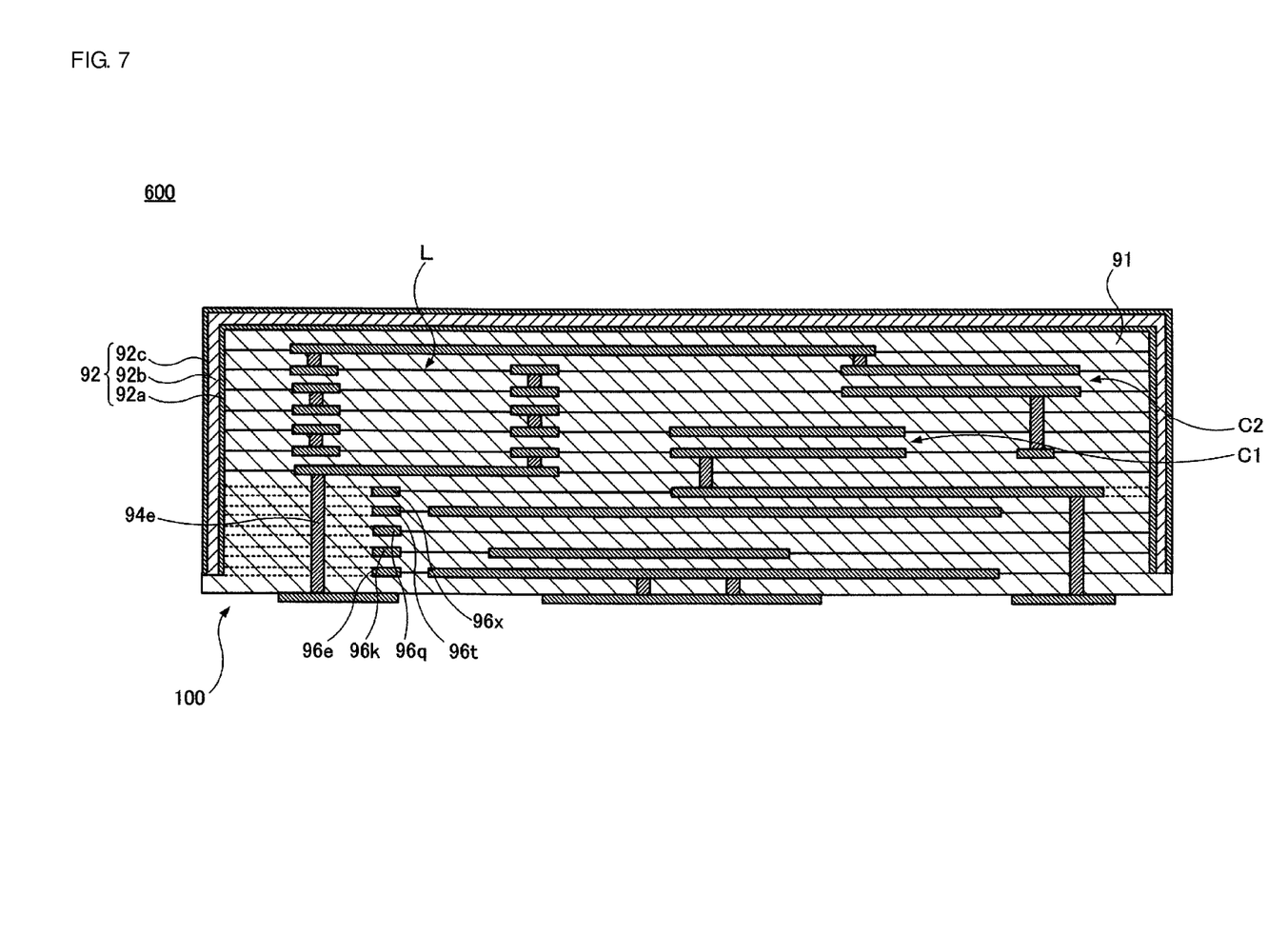
FIG. 7 is a cross-sectional view of a multilayer electronic component 600 according to a sixth preferred embodiment of the present invention.

FIG. 7 is a diagram illustrating a multilayer electronic component 600 according to the sixth preferred embodiment of the present invention. FIG. 7 is a cross-sectional view of the multilayer electronic component 600.

The module 200 according to the second preferred embodiment includes the electronic components 51a to 51c and the like disposed on the upper main surface of the multilayer circuit board 100 according to the first preferred embodiment. The multilayer electronic component 600 according to the sixth preferred embodiment includes, instead of the electronic components 51a to 51c and the like, for example, an inductor L and capacitors C1 and C2 provided in a laminate 91.

In the laminate 91 in the multilayer electronic component 600, a circuit such as an LC filter is defined by the inductor L and the capacitors C1 and C2.

In the multilayer electronic component 600, a shield electrode layer 92 including three layers, a lower layer 92a made of SUS, a middle layer 92b made of Cu, and an upper layer 92c made of SUS, is provided on the side surfaces and upper main surface of the laminate 91.

In the multilayer electronic component 600, each of surrounding conductive patterns 96e, 96k, 96t, and 96x is provided at or on an interlayer in the laminate 91. Both ends of each of the surrounding conductive patterns 96e, 96k, 96t, and 96x are connected to the shield electrode layer 92. All of the surrounding conductive patterns 96e, 96k, 96t, and 96x surround a via conductor 94e that is an element to be shielded.

The multilayer electronic component 600 according to the sixth preferred embodiment has excellent isolation characteristics because a portion in need of shielding is shielded by the surrounding conductive patterns 96e, 96k, 96t, and 96x.

The multilayer circuit board 100 according to the first preferred embodiment, the module 200 according to the second preferred embodiment, the multilayer circuit boards 300 to 500 according to the third to five preferred embodiments, and the multilayer electronic component 600 according to the sixth preferred embodiment have been described.

The present invention is not limited to the contents described above, and various changes can be made thereto without departing from the spirit and scope of the present invention.

For example, the stacking diagram of the insulating layers 1a to 1g in the laminate 1 in the multilayer circuit board 100 according to the first preferred embodiment illustrated in FIG. 2 is merely illustrative. That is, a circuit provided in the multilayer circuit board 100 is not limited to the above-described circuit, and various circuits can be provided. In the laminate 1, in addition to a capacitor and an inductor, other types of components such as a resistor may be provided.

In the module 200 according to the second preferred embodiment, a semiconductor device and passive components such as a capacitor, an inductor, and a resistor are disposed on the upper main surface of the laminate 1 as the electronic components 51a to 51c. However, electronic components to be disposed are not limited to these components and any type of electronic component may be disposed. For example, an elastic wave device may be disposed.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer circuit board comprising:
   a laminate including a plurality of insulating layers;
   conductive patterns each provided at an interlayer between corresponding ones of the plurality of insulating layers;
   a via conductor extending through at least one of the plurality of insulating layers; and
   an external terminal provided on a lower main surface of the laminate; wherein a shield electrode layer connected to a ground potential is provided on at least one side surface of the laminate;
   at least one surrounding conductive pattern surrounding an element to be shielded is provided at an interlayer between corresponding ones of the plurality of insulating layers as one of the conductive patterns;
   the surrounding conductive pattern defines an opening in which the element to be shielded is provided;
   the surrounding conductive pattern includes a first end and a second end;
   the first and second ends of the surrounding conductive pattern are each directly connected to the shield electrode layer on the same side surface of the laminate, and each have a strip shape that longitudinally extends in a direction that intersects with the same side surface of the laminate;
   the element to be shielded is surrounded by the surrounding conductive pattern and the shield electrode layer when the laminate is seen in a direction in which the plurality of insulating layers are laminated;
   the surrounding conductive pattern and the element to be shielded are provided at or in different interlayers between corresponding ones of the insulating layers;
   the surrounding conductive pattern and the element to be shielded overlap when the laminate is seen through in the direction in which the insulating layers are laminated; and
   a capacitor is defined by a capacitance between the surrounding conductive pattern and the element to be shielded.

2. The multilayer circuit board according to claim 1, wherein the element to be shielded is at least one of a wiring conductive pattern, a capacitor conductive pattern, an inductor conductive pattern, the via conductor, and the external terminal.

3. The multilayer circuit board according to claim 1, wherein a portion of the surrounding conductive pattern that is opposite to the element to be shielded and the shield electrode layer is interconnected to a ground conductive pattern.

4. A multilayer electronic component comprising the multilayer circuit board according to claim 1, wherein the shield electrode layer provided on the at least one side surface of the laminate extends to cover an upper main surface of the laminate.

5. A module comprising the multilayer circuit board according to claim 1, wherein
   a mounting terminal is provided on an upper main surface of the multilayer circuit board;
   an electronic component is disposed on the mounting terminal;
   a sealing resin layer is provided on the upper main surface of the multilayer circuit board to cover the electronic component; and
   the shield electrode layer provided on the at least one side surface of the multilayer circuit board extends to cap a surface of the sealing resin layer.

* * * * *